United States Patent
Trimberger et al.

(10) Patent No.: US 7,218,567 B1
(45) Date of Patent: May 15, 2007

(54) METHOD AND APPARATUS FOR THE PROTECTION OF SENSITIVE DATA WITHIN AN INTEGRATED CIRCUIT

(75) Inventors: Stephen M. Trimberger, San Jose, CA (US); Weiguang Lu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 76 days.

(21) Appl. No.: 11/234,595

(22) Filed: Sep. 23, 2005

(51) Int. Cl.
*G11C 5/14* (2006.01)

(52) U.S. Cl. .................. 365/228; 365/189.08; 365/226

(58) Field of Classification Search ................ 365/226, 365/228, 229, 230.05, 201, 189.08, 233
See application file for complete search history.

(56) References Cited

U.S. PATENT DOCUMENTS 5,581,198 A * 12/1996 Trimberger .................. 326/38
5,844,844 A * 12/1998 Bauer et al. ........... 365/189.05
6,357,037 B1 * 3/2002 Burnham et al. ............. 716/17

* cited by examiner

*Primary Examiner*—Son Dinh
*Assistant Examiner*—Hien N Nguyen
(74) *Attorney, Agent, or Firm*—LeRoy D. Maunu; Michael T. Wallace

(57) ABSTRACT

Methods and apparatus for the protection of memory within an integrated circuit (IC) are provided for various phases of operation of the IC. Various portions of sensitive data may be contained within battery backed random access memory (RAM) (310), which may then be protected using either a passive, or an active, zeroization sequence depending upon the phase of operation of the IC. In an idle state, detection circuit (324) senses a drop in battery power ($V_{BATT}$) to launch active destruction of RAM (310) memory using active zeroization circuits (312 and 314). In a configuration state, detection circuit (402) or (504) senses a drop in battery power ($V_{BATT}$) to launch active destruction of RAM (310) memory using active zeroization circuits (312 and 314). In an operational state, various methods may be employed to detect and counteract the unauthorized access to RAM (310).

20 Claims, 5 Drawing Sheets

METHOD AND APPARATUS FOR THE PROTECTION OF SENSITIVE DATA WITHIN AN INTEGRATED CIRCUIT

FIELD OF THE INVENTION

The present invention generally relates to integrated circuits (ICs), and more particularly to protection of the decryption keys used to decrypt the configuration data stream to the ICs.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

PLDs, however, may be susceptible to configuration data attacks, whereby the configuration data stream used to configure the PLDs may be intercepted without authorization by a hostile entity. Once intercepted, the configuration data stream may then be downloaded into the hostile entities' PLD and used to configure the PLD to perform the logic function defined by the intercepted configuration data stream.

One countermeasure that may be used to prevent the unauthorized use of the intercepted configuration data stream, is to encrypt the configuration data stream prior to transmission to the PLD. The PLD may then decrypt the configuration data stream to internally recreate the intended configuration. In order for the PLD to decrypt the configuration data stream, however, decryption keys are required by the internal decryptor.

The decryption keys may typically be stored in a few hundred bits of volatile random access memory (RAM) and may be maintained in the volatile RAM through the use of an external battery to enhance security. That is to say, for example, that security is enhanced by providing the ability to remove the connection to the external battery, thus allowing the stored contents within the volatile RAM to be passively erased. Such decryption key protection is typically known as passive zeroization, whereby memory contents within the volatile RAM are allowed to "bleed away" when battery power is removed, but may not provide the level of protection required by today's PLD users. Conventional zeroization techniques such as this do not, however, provide protection of the decryption keys under all phases of operation. Accordingly, efforts continue to decrease the susceptibility to attack during all phases of PLD operation. Such efforts should strive to minimize the cost of protection, through the use of a minimum number of additional external pins on the PLD.

SUMMARY

To overcome limitations in the prior art, and to overcome other limitations that will become apparent upon reading and understanding the present specification, various embodiments of the present invention disclose a method and apparatus to protect internally stored decryption keys from attack during all phases of PLD operation without the need for additional external programming pins.

In accordance with one embodiment of the invention, an integrated circuit (IC) comprises a memory storage device that is coupled to a power supply, the memory storage device is further coupled to receive data and is adapted to store the data in protected memory within the memory storage device. The IC further comprises a detection circuit that is coupled to the power supply, the detection circuit is adapted to detect a power loss associated with the power supply in all phases of operation of the IC and is further adapted to provide a tamper signal in response to detecting the power loss. The IC further comprises a zeroization circuit that is coupled to the memory storage device and the detection circuit, the zeroization circuit is adapted to overwrite the protected memory in response to the tamper signal.

In accordance with another embodiment of the invention, a method of protecting sensitive data within an integrated circuit (IC) comprises storing sensitive data within protected memory locations of the IC, detecting unauthorized access to the protected memory locations in all phases of operation of the IC, and destroying the sensitive data in response to detecting the unauthorized access to the protected memory locations.

In accordance with another embodiment of the invention, a programmable logic device (PLD) comprises a memory storage device that is coupled to receive decryption keys and is adapted to store the decryption keys in a protected memory location within the memory storage device. The PLD further comprises a decryptor that is coupled to receive the decryption keys from the memory storage device and is coupled to receive an encrypted configuration data stream, the decryptor being adapted to decrypt the encrypted configuration data stream using the decryption keys to configure the PLD. The PLD further comprises a zeroization circuit that is coupled to the memory storage device and is coupled to receive a zeroization command signal, the zeroization circuit being adapted to overwrite the protected memory location in response to the zeroization command signal.

BRIEF DESCRIPTION OF THE DRAWINGS

Various aspects and advantages of the invention will become apparent upon review of the following detailed description and upon reference to the drawings, in which.

DETAILED DESCRIPTION

Generally, various embodiments of the present invention provide methods and apparatus for the protection of memory within an integrated circuit (IC). Various phases of operation of the IC are identified, whereby IC tampering may be detected and zeroization sequences deployed within the IC to prevent the unauthorized access to sensitive data within the IC.

In one embodiment, the IC may be exemplified by a PLD, which receives configuration data from an external device, the configuration data being effective to program the PLD for a specific logic function. The configuration data may, in some instances, be encrypted in accordance with a particular encryption standard. The PLD, therefore, contains decryption key information, which is necessary for the internal decryption of the encrypted configuration data stream. Storing decryption keys within the PLD, however, makes the PLD vulnerable to decryption key attack, whereby the decryption keys may be accessed by unauthorized users and later used to configure their PLDs with highly valuable logic functionality. Thus, methods and apparatus are provided for the detection of unauthorized access to the internally stored decryption keys and the subsequent destruction of those keys once the unauthorized access is detected. One of ordinary skill in the art recognizes that these same methods and apparatus may be used for the protection of any type of sensitive data that may be contained within the PLD and are not necessarily limited only to the protection of decryption keys.

Figure 1:
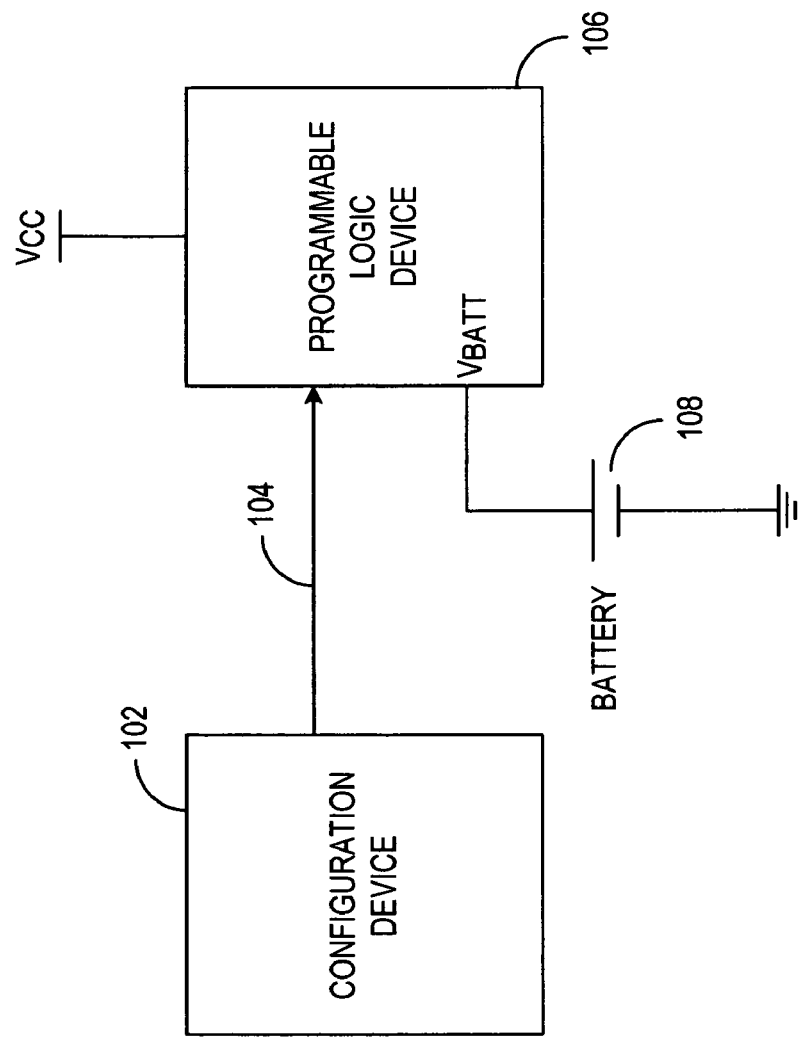
FIG. 1 illustrates an exemplary single device, configuration bitstream security reference circuit.

The block diagram of FIG. 1 exemplifies a single device, configuration bitstream security reference circuit, which illustrates programmable logic device (PLD) 106 as receiving either encrypted, or non-encrypted, configuration data stream 104 from configuration device 102. Configuration device 102 may, for example, employ design tools that accept hardware design language (HDL) definitions, or schematics, which are then used to generate net lists to indicate point to point connectivity of reconfigurable logic and interconnect resources within PLD 106. From the net lists, additional tools map the design to logic, determine the optimal placement of the logic, and then route signal paths between the logic. From this "place and route" operation, a configuration bit file is generated, which may then be encrypted prior to being transmitted as configuration bitstream 104 to program PLD 106.

One of the most widely accepted encryption formats is defined by the Data Encryption Standard (DES) and has been used in countless applications. Since the inception of the DES, however, the Triple DES (TDES) algorithm was added to the standard, which provides a key strength that may be considered to be absolutely secure and suitable for highly sensitive applications. Although the TDES algorithm remains effective against attacks, the Advanced Encryption Standard (AES) is replacing TDES in many applications as the most secure encryption scheme. AES employs a cipher lock, which substantially eliminates symmetry that was found to be one of the shortcomings of the DES key. Furthermore, the non-linearity of the AES expansion key practically eliminates the possibility of equivalent keys, which produces a key strength that is acceptable for use in today's most sensitive applications.

No matter which encryption implementation is employed, PLD 106 employs a compatible decryptor (not shown) that may be enabled to allow decryption of configuration bit stream 104. Internal decryption keys may also be stored in dedicated random access memory (RAM) (not shown) within PLD 106, which may be backed-up using either external battery 108, and/or the $V_{CC}$ power supply.

In one mode of operation, the internal RAM may be powered by external battery 108, whereby as long as external battery 108 remains connected to PLD 106, the decryption keys remain available in memory. Once the internal RAM is disconnected from external battery 108, however, the internal RAM is no longer able to retain data within its memory locations, thus allowing the decryption keys that are stored within the internal RAM's memory locations to be erased through passive zeroization. Thus, a high degree of security is provided using a passive zeroization solution, whereby in the event that PLD tampering is detected, battery power may be removed from the internal RAM to promote the destruction of the decryption key(s).

In an alternate mode of operation, the internal RAM may also be powered by an auxiliary power supply, e.g., $V_{CC}$, in addition to external battery 108. In such instances, the internal RAM may derive operational power from $V_{CC}$ under normal operating conditions, and may derive operational power from external battery 108 when in an idle state, i.e., when $V_{CC}$ is at a low voltage level. Such an implementation provides reduced battery drain, since $V_{CC}$ is usually generated by one of a switched, or linear, power supply to provide power to the internal RAM under normal operating conditions.

In this mode of operation, active zeroization may instead be used to destroy the decryption keys, since under normal operating conditions, operational power derived from $V_{CC}$ is effective to maintain the decryption keys in memory, which precludes use of passive zeroization. Active zeroization, therefore, may be defined as the proactive sequence of events that are undertaken to insure that decryption key memory within the internal RAM is destroyed by overwriting the decryption key memory with a predetermined data pattern upon command.

Whether active zeroization and/or passive zeroization is used, a comprehensive solution is nevertheless required, since PLD 106 may be attacked during one or more of at least three states, or phases, of operation. In a first phase of operation, i.e., the idle state, PLD 106 is non-operational when power supply $V_{CC}$ is at a low voltage level. External battery 108 is, therefore, utilized to maintain operational power to the internal RAM so that previously loaded decryption keys may be maintained. Thus, the idle state presents an opportunity for unauthorized decryption key access, whereby passive zeroization may be used to destroy the decryption keys in the event that PLD tampering is detected. In an alternate embodiment during the idle state, active zeroization may also be implemented as discussed in more detail below. In this instance, since $V_{CC}$ is at a low voltage level, external battery 108, or an alternate power source, is required to provide the power that is needed to destroy the decryption keys if active zeroization is selected during the idle state.

In a second phase of operation, i.e., the configuration state, PLD 106 is under operational power, i.e., $V_{CC}$ is at a high voltage level, but the PLD has not yet been configured, so internal user logic is not operational. In the configuration state, the PLD may be in the process of being configured, whereby configuration data stream 104 may be received in either an encrypted, or an un-encrypted format. It should be noted, that configuration data stream 104 may be received in a non-encrypted format, even though decryption keys exist within PLD 106. In this instance, other precautions should be undertaken, as discussed in more detail below, to prevent unauthorized access to the decryption keys during configuration using a non-encrypted configuration data stream.

In the configuration state, the internal RAM continues to receive operational power from external battery 108, regardless of the voltage level of $V_{CC}$, thus providing an opportunity for unauthorized decryption key access. Thus, the decryption keys held within the internal RAM may still be cleared via passive zeroization by removing the connection to external battery 108. In some PLDs, however, $V_{CC}$ provides power to the internal RAM in the configuration state, so passive zeroization is not possible. In either case, active zeroization may be implemented, since the external battery, or an alternate power source such as $V_{CC}$, may be used to provide the power that is needed to destroy the decryption keys if active zeroization is selected during the configuration state.

In a third phase of operation, i.e., the operational state, PLD 106 is fully configured and operating in its desired logic configuration. In this instance, $V_{CC}$ is effective to provide operational power to the internal RAM, in order to reduce the excessive current drain from external battery 108 during the operational state. As such, destruction of the decryption keys is implemented via active zeroization, since passive zeroization is not possible. It can be seen, therefore, that since PLD 106 may be vulnerable to attack in all three phases of operation, protection against decryption key attack is provided via passive zeroization, active zeroization, or a combination of the two, in order to provide complete protection during all three states.

Figure 2:
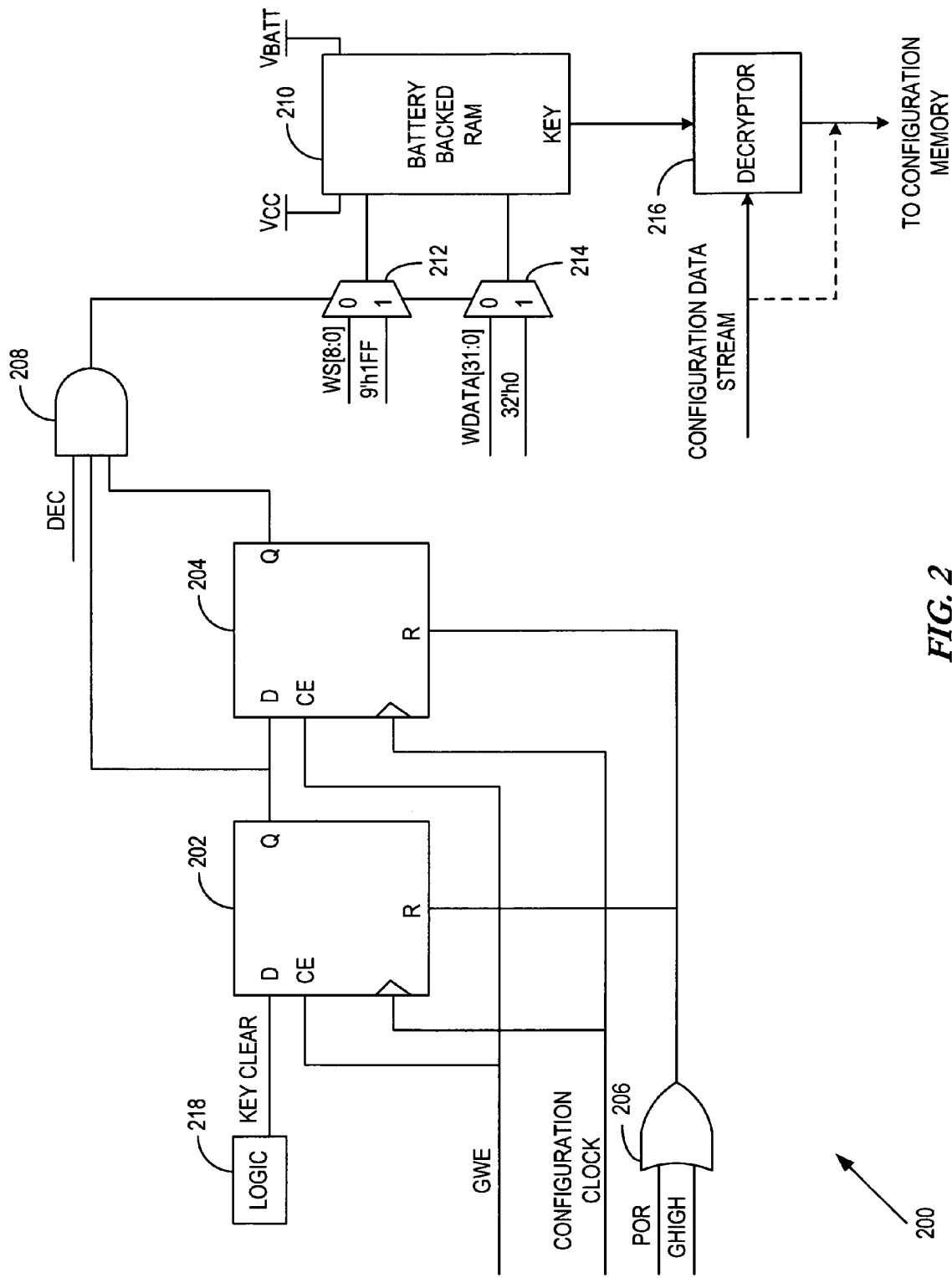
FIG. 2 illustrates an exemplary zeroization schematic for use during an operational state of a programmable logic device (PLD)

Turning to FIG. 2, one embodiment of zeroization schematic 200 is exemplified, in which active zeroization may be implemented during the operational state of PLD 106. D flip-flops 202 and 204 are configured in a series orientation, whereby zeroization command signal KEY CLEAR is asserted by logic block 218. The zeroization command signal, KEY CLEAR, is asserted by logic block 218, when active zeroization is requested. A second D flip-flop 204 may be implemented in series with D flip-flop 202 to provide, for example, a debounced mode of operation. In particular, since zeroization command signal KEY CLEAR may represent a level sensitive signal, as opposed to an edge triggered signal, two (or possibly more) D flip-flops may be selected to provide sufficient safeguard against possible glitches on signal KEY CLEAR from logic block 218. It should be noted, that one skilled in the art is able to apply other well-known methods for filtering glitches on the KEY CLEAR signal to prevent activation of an unwanted zeroization sequence.

AND gate 208 represents a multiple input AND gate, whereby the outputs of both D flip-flops 202 and 204 must be in a logic high agreement before the output of AND gate 208 is asserted to a logic high level (assuming that signal DEC is also at a high logic level). It should be noted that if more series connected D flip-flops are utilized, then the number of inputs to AND gate 208 may be increased to correspond to the number of D flip-flops used. In such a way, the outputs of each serially connected D flip-flop may be monitored for unanimous logic high agreement prior to establishing an active zeroization sequence.

Optional signal DEC may also be received by AND gate 208, so that an active zeroization gating function may be utilized. As discussed above, for example, a non-encrypted configuration data stream may be used to configure PLD 106, regardless of the presence of a decryption key within battery-backed RAM 210. Thus, the active zeroization sequence may be gated off by a logic low level of signal DEC, since if signal DEC assumes a logic low level, the output of AND gate 208 remains at a logic low level, regardless of the logic level of the Q outputs of D flip-flops 202 and 204. In one embodiment, signal DEC may represent an internal signal to PLD 106 that is programmed by configuration bit stream 104 to indicate that encryption/decryption is enabled. Thus, signal DEC may be used to render zeroization command signal KEY CLEAR inoperative if encryption/decryption is disabled. Stated differently, active zeroization may only be activated when signal DEC is asserted.

Multiplexers 212 and 214 receive the output of AND gate 208 at their respective input selection controls. If, for example, the output of AND gate 208 is at a logic low level, then signals WS[8:0] and WDATA[31:0] are selected at the respective outputs of multiplexers 212 and 214. If, on the other hand, the output of AND gate 208 is at a logic high level, then signals 9'h1ff and 32'h0 are selected at the respective outputs of multiplexers 212 and 214. If the output of AND gate 208 is at a logic low level, multiplexer 212 selects the 9-bit word select signal, WS[8:0], to battery backed RAM 210, while multiplexer 214 selects the 32-bit data word signal, WDATA[31:0], to battery backed RAM 210. Thus, while the output of AND gate is at a logic low level, a valid decryption key may be written into battery backed RAM 210 in, for example, 9, 32-bit words, for a total of 288 bits.

If the output of AND gate 208 is at a logic high level, on the other hand, an active zeroization sequence is activated by zeroization command signal KEY CLEAR. During active zeroization, multiplexer 212 provides zeroization address signal, 9'h1ff, to battery backed RAM 210, enabling write access to all memory words, while multiplexer 214 provides zeroization data signal, 32'h0, to battery backed RAM 210. As such, zeroization data signal 32'h0 is written to all addresses selected by zeroization address signal 9'h1ff so that the respective decryption key memory locations within battery backed RAM 210 may undergo active zeroization as quickly as possible. It should be noted that each data bit within zeroization data signal 32'h0 may be selected to a logic high, or a logic low level as required. As such, virtually any digital word in the 32-bit data space defined by zeroization data signal 32'h0 may be selected, which includes a logic low zeroization data signal, i.e., $00000000_{hex}$, or a logic high zeroization data signal, e.g., $FFFFFFFF_{hex}$, or any data combination in between.

In one embodiment, zeroization command signal KEY CLEAR may be provided to D flip-flop 202 as an internal signal within PLD 106. For example, logic block 218 may exist internally within the programmable logic portion of PLD 106, such that once PLD 106 is configured, logic block 218 may be defined by the programmable logic and controlled accordingly. Such an implementation provides for a reduced pin count for the PLD, since the zeroization command signal, KEY CLEAR, is asserted internally. Alternately, zeroization command signal KEY CLEAR may instead be provided to D flip-flop 202 as an external signal. For example, zeroization command signal KEY CLEAR may be asserted externally to PLD 106 and received by a dedicated pin or by one of many input/output (I/O) blocks (IOBs), or other interfaces that may exist within PLD 106. In an alternate embodiment to reduce the number of I/O pins existent on the PLD, zeroization command signal KEY CLEAR may be connected to the external battery voltage, $V_{BATT}$, which supplies power to the internal RAM when the PLD is powered-off.

Signals GWE, CONFIGURATION CLOCK, and GHIGH are configuration signals used internally within PLD 106 to administer the various execution states of PLD 106. Signal GWE enables D flip-flops 202 and 204 for active zeroization operation as directed by zeroization command signal KEY CLEAR and signal CONFIGURATION CLOCK. Internal signal GHIGH remains asserted while PLD 106 is operating in the configuration state, so that D flip-flops 202 and 204 may be inhibited from latching zeroization command signal KEY CLEAR, which may be in a volatile state during configuration. During a power-on reset (POR) condition, internal signal POR maintains D flip-flops 202 and 204 in a similarly inhibited output state. Both the POR and GHIGH signals are selected through operation of OR gate 206.

In operation during the configuration state, therefore, the active zeroization circuit consisting of logic block 218, D flip-flops 202 and 204, AND gate 208, and multiplexers 212 and 214 defaults to allow decryption key configuration, while simultaneously inhibiting active zeroization. The decryption key may then be written to battery backed RAM 210 via signals WDATA and WS, as discussed above, according to the IEEE 1532 in-system PLD programming protocol, for example, which uses the boundary scan technique as defined by IEEE 1149.1. Once PLD 106 is fully configured, PLD 106 enters the operational state, whereby signals POR and GHIGH are deasserted to allow active zeroization as gated by signal DEC.

In operation during the operational state, decryption keys stored within battery backed RAM 210 may be provided to decryptor 216 in the event that signal CONFIGURATION DATA STREAM is encrypted. In this instance, decryptor 216 may decrypt the encrypted configuration data stream in accordance with any number of decryption standards, such as for example, DES, TDES, or AES. In the event that PLD 106 is being tampered with, or the decryption keys otherwise become compromised, active zeroization may be invoked via zeroization command signal KEY CLEAR to destroy the decryption keys stored within battery backed RAM 210.

In particular, the active zeroization process is commenced through assertion of zeroization command signal KEY CLEAR via logic block 218 of PLD 106. The asserted logic value of zeroization command signal KEY CLEAR is then latched by D flip-flops 202 and 204, the outputs of which are monitored by gating circuit 208. Given that signal CONFIGURATION DATA STREAM is an encrypted configuration data stream, then signal DEC is also asserted. In such an instance, the output of gating circuit 208 is asserted to a logic high value, in which case, multiplexers 212 and 214 select their respective zeroization data address and zeroization data signals to wipe, i.e., erase, the decryption keys from battery backed RAM 210 memory. In the event that signal CONFIGURATION DATA STREAM is not encrypted, on the other hand, signal DEC may be deasserted, so that the active zeroization circuit may be inhibited despite the logic value of zeroization command signal KEY CLEAR. In this instance, signal CONFIGURATION DATA STREAM may bypass decryptor 216 as denoted by the dashed line connection to configuration memory.

Figure 3:
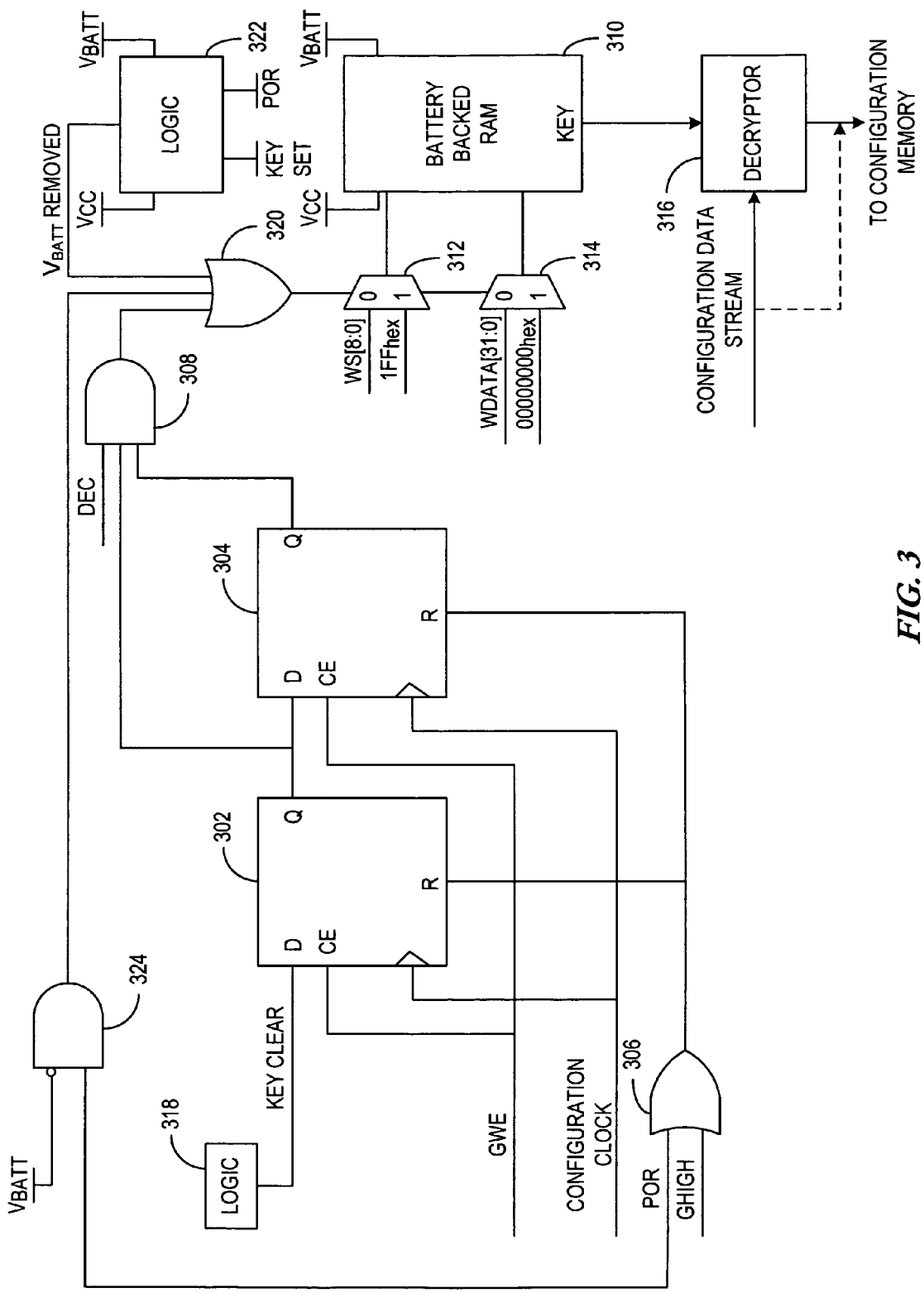
FIG. 3 illustrates an alternate zeroization schematic for use during several phases of operation of a PLD.

Turning to FIG. 3, an exemplary zeroization schematic is illustrated, in which decryption key protection is provided in all three phases of operation, i.e., the idle state, the configuration state, and the operational state. In the operational state, for example, the active zeroization circuit including logic block 318, D flip-flops 302 and 304, AND gate 308, and multiplexers 312 and 314 operate substantially as described above in relation to FIG. 2. In response to internally generated zeroization command signal KEY CLEAR from logic block 318, decryption keys stored within battery backed RAM 310 may be erased from memory by the active zeroization circuit, given that signal CONFIGURATION DATA STREAM is an encrypted configuration data stream, as indicated by the asserted logic value of signal DEC.

In one embodiment, decryption keys may exist within battery backed RAM 310, even though signal CONFIGURATION DATA STREAM is non-encrypted. In such instances, however, signal DEC is effective to inhibit the operation of zeroization command signal KEY CLEAR, since signal DEC is at a logic low level to indicate the use of a non-encrypted configuration data stream. Thus, in order to protect the decryption keys from attack in the event that a non-encrypted configuration data stream is being used, signal DEC may instead be forced to a logic high value to enable the active zeroization circuit regardless of whether an encrypted, or a non-encrypted, configuration data stream is being used. In other embodiments, restricting signal CONFIGURATION DATA STREAM to use only encrypted formats may be required, so that signal DEC may be asserted to a high logic level to allow positive gating of zeroization command signal, KEY CLEAR, as latched by D flip-flops 302 and 304.

Since zeroization command signal KEY CLEAR may be internally generated by logic block 318 of PLD 106, it can be conceived that an attack on that portion of the configuration data stream that defines the operation of logic block 318 may be launched. In particular, if an insufficient number of control bits are required by logic block 318 from within PLD 106 to assert zeroization command signal KEY CLEAR, then those control bits may be intercepted by a potential attacker and scrambled in order to avoid initiation of an active zeroization sequence. In order to defeat such a "scramble-the-bits" attack, activation of zeroization command signal KEY CLEAR may require the use of an extended number of bits, e.g., 32, that may be spread over several frames of PLD 106 control data, where each bit of the 32-bit KEY CLEAR activation signal is required by logic block 318 to activate zeroization command signal KEY CLEAR. If any bit of the 32-bit sequence is not received properly, for example, then logic block 318 may default to assert zeroization command signal KEY CLEAR to a logic high value. In other words, the existence of a perturbed 32-bit sequence received by logic block 318 may indicate that an attack on the active zeroization sequence has been attempted, which would then automatically initiate an active zeroization sequence.

Protection of the decryption keys stored in battery backed RAM 310 may also be implemented during a power up sequence of PLD 106, prior to the execution of the configuration state. In such an instance, the voltage level of external battery $V_{BATT}$ may be monitored by AND gate 324 along with signal POR to detect a high to low transition of signal $V_{BATT}$ during the power up sequence, whereby signal POR, may be an internal signal that indicates that PLD 106 is either in the power up sequence or the configuration state. During the power up sequence, for example, signal POR is asserted to a logic high value, which as discussed above, is effective to inhibit the outputs of D flip-flops 302 and 304. Once D flip-flops 302 and 304 are inhibited, zeroization command signal KEY CLEAR is rendered ineffective to initiate the active zeroization sequence during a power up sequence.

Accordingly, AND gate 324, in conjunction with OR gate 320, provides the tamper signal, which initiates active zeroization during a power up sequence, when PLD tampering is detected. In particular, removal of external battery 108 causes a logic high to a logic low transition of signal $V_{BATT}$, which is effective to render the output of AND gate 324 to a logic high level during a power up sequence. The output of OR gate 320 is subsequently rendered to an active high logic level, which is then effective to initiate the active zeroization sequence as discussed above. Significantly, the $V_{BATT}$ signal is being used to generate the tamper signal, so that no additional pins are required on PLD 106 to activate the zeroization sequence during the configuration state.

Alternate methods may be employed to provide protection of the decryption keys when power supply $V_{CC}$ is at a low voltage level, either before or during the configuration state. In one embodiment, logic block 322 may include a latching mechanism that receives operational power from a capacitive component that is charged by external battery $V_{BATT}$ as exemplified by logic block 322 of FIG. 4. Capacitor 406 may either be configured within the same integrated circuit (IC) package which contains PLD 106, or capacitor 406 may instead by constructed within the same semiconductor die as PLD 106. Resistor 404 may be similarly implemented to provide a sufficient resistance so as to isolate the input terminal of latch 402 from the power supply terminal, $V_{CC}$, of latch 402.

In operation, capacitor 406 is charged through resistor 404 by external battery $V_{BATT}$ to supply operating power to latch 402 via node 408. In addition, node 408 provides operating power to inverters 412 and 416, as well as monostable multivibrator, i.e., one-shot, 410. Resistor 418 is sized sufficiently large, so as to minimize the current drain from external battery $V_{BATT}$, while at the same time establishing the correct logic low voltage at the input to inverter 412 and the input terminal of latch 402 in the event that external battery $V_{BATT}$ is removed.

Once external battery $V_{BATT}$ is removed, the input to latch 402 and the input to inverter 412 transitions to a logic low value. The subsequent logic high output of inverter 412 then triggers one-shot 410 to supply a logic transition to the clock input of latch 402, which latches a logic low value to the input of inverter 416. Once latched, the output of inverter 416 provides an indication that external battery $V_{BATT}$ has been removed. AND gate 414 gates the output of inverter 416 with signal POR, so that the output of AND gate 414 is only asserted to a logic high value if signal POR is also asserted, meaning that external battery $V_{BATT}$ was removed while $V_{CC}$ was non-operational. The output of AND gate 414 may then be registered by register 420 when POR is active and the tamper signal, $V_{BATT}$ REMOVED, is then supplied to OR gate 320, so that once $V_{CC}$ becomes active, an active zeroization sequence may be initiated as discussed above.

Figures 4, 5:
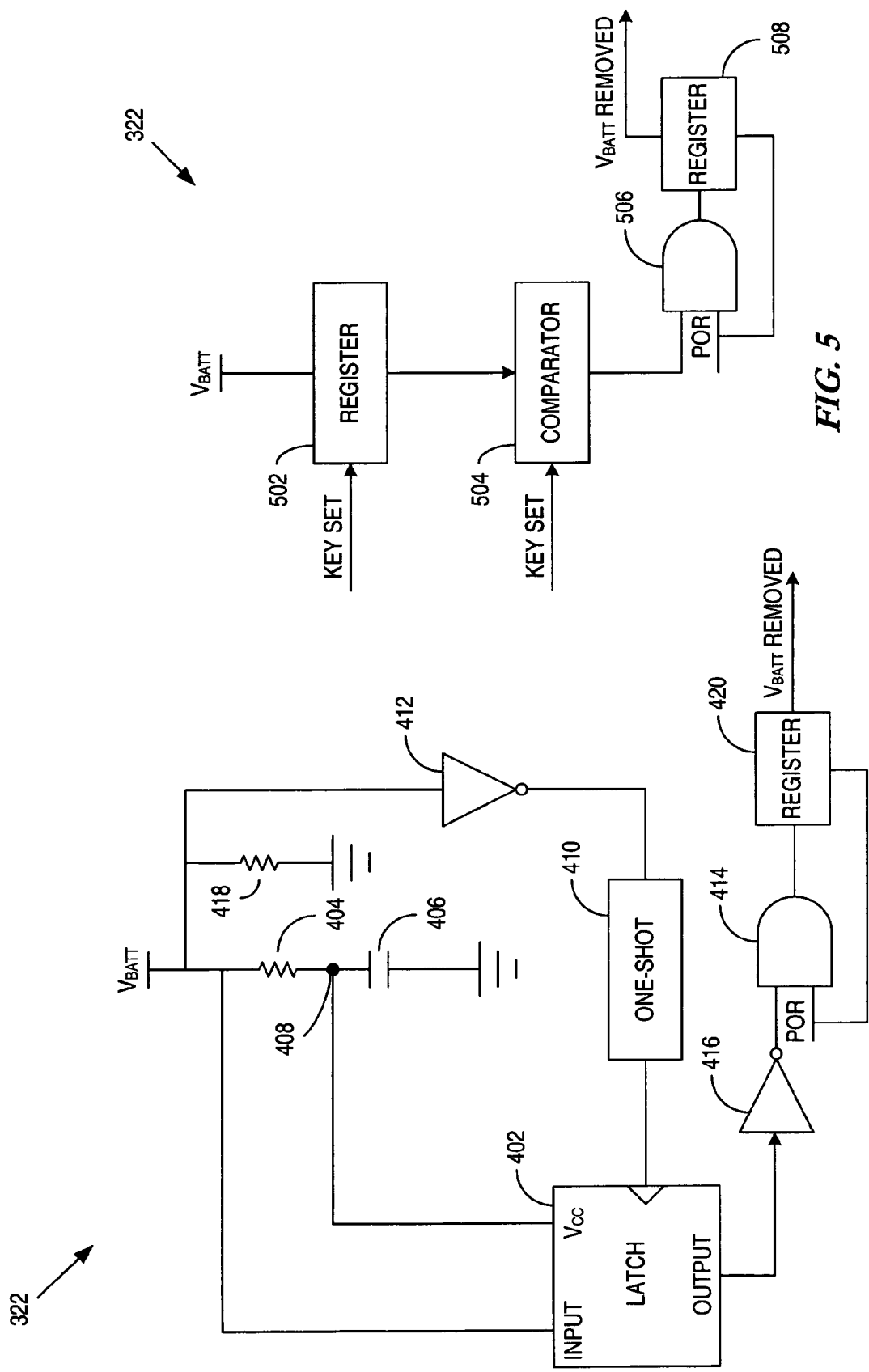
FIG. 4 illustrates an exemplary schematic diagram of a detection circuit used to generate a PLD tamper signal.
FIG. 5 illustrates an alternate schematic diagram of a detection circuit used to generate a PLD tamper signal.

In an alternate embodiment as exemplified by logic block 322 of FIG. 5, logic block 322 may accept a verification code, i.e., signal KEY SET, that may be programmed into battery backed register 502 once decryption keys have been loaded into battery backed RAM 310. Signal KEY SET may represent a multi-bit code having a varying distribution of logic high and logic low valued bits, whereby in one exemplary embodiment, signal KEY SET may represent an 8-bit code whose value is 8'b01010100. Should external battery $V_{BATT}$ be removed at any time prior to start up, at least one of the bits within battery backed register 502 will have most likely flipped logic states due to the removal of external battery $V_{BATT}$. Upon subsequent power-on, POR is asserted and comparator 504 compares the output of register 502 with the original value of signal KEY SET. A difference indicates a change in the register value that implies that signal $V_{BATT}$ had been at a low voltage level at some time while $V_{CC}$ was removed. The change in the register value is indicative of tampering, which necessitates active zeroization. Comparison of the output of register 502 with the original value of signal KEY SET is effective to render the output of comparator 504 to a logic high value, indicating that the comparison is unequal. The output of comparator 504 may then be gated and registered with signal POR, so that a determination may be made that signal KEY SET changed while the FPGA was powered-off. Tamper signal, $V_{BATT}$ REMOVED, is then supplied to OR gate 320, such that once $V_{CC}$ becomes active, an active zeroization sequence may be initiated as discussed above. Note that while a low $V_{BATT}$ voltage by its very nature provides passive zeroization of the internal RAM, subsequent active zeroization provides greater security. Further, in applications where $V_{BATT}$ may glitch, comparator 504 may assert a mismatch only if multiple bits of signal KEY SET do not match, thus providing glitch protection.

In alternate embodiments, OR gate 320 and multiplexers 312 and 314 may derive their operational power from external battery $V_{BATT}$ as well. In such instances, once external battery $V_{BATT}$ is re-applied and tamper signal $V_{BATT}$ REMOVED has been asserted, the active zeroization sequence is initiated immediately using power provided by external battery $V_{BATT}$, regardless of whether $V_{CC}$ becomes active. Thus, a probability exists that external battery $V_{BATT}$ may be completely depleted of energy during the active zeroization process. However, since the objective is to disable PLD 106 by clearing the decryption keys anyway, a fully depleted external battery only adds to the security level achieved. Alternately, the power stored within capacitor 406 of FIG. 4 may instead be used to provide the operational power needed during the active zeroization sequence by multiplexers 312 and 314, and OR gate 320. In this embodiment, the output of inverter 416 may be used as tamper signal, $V_{BATT}$ REMOVED, so that AND gate 414 and register 420 may be removed.

Figure 6:
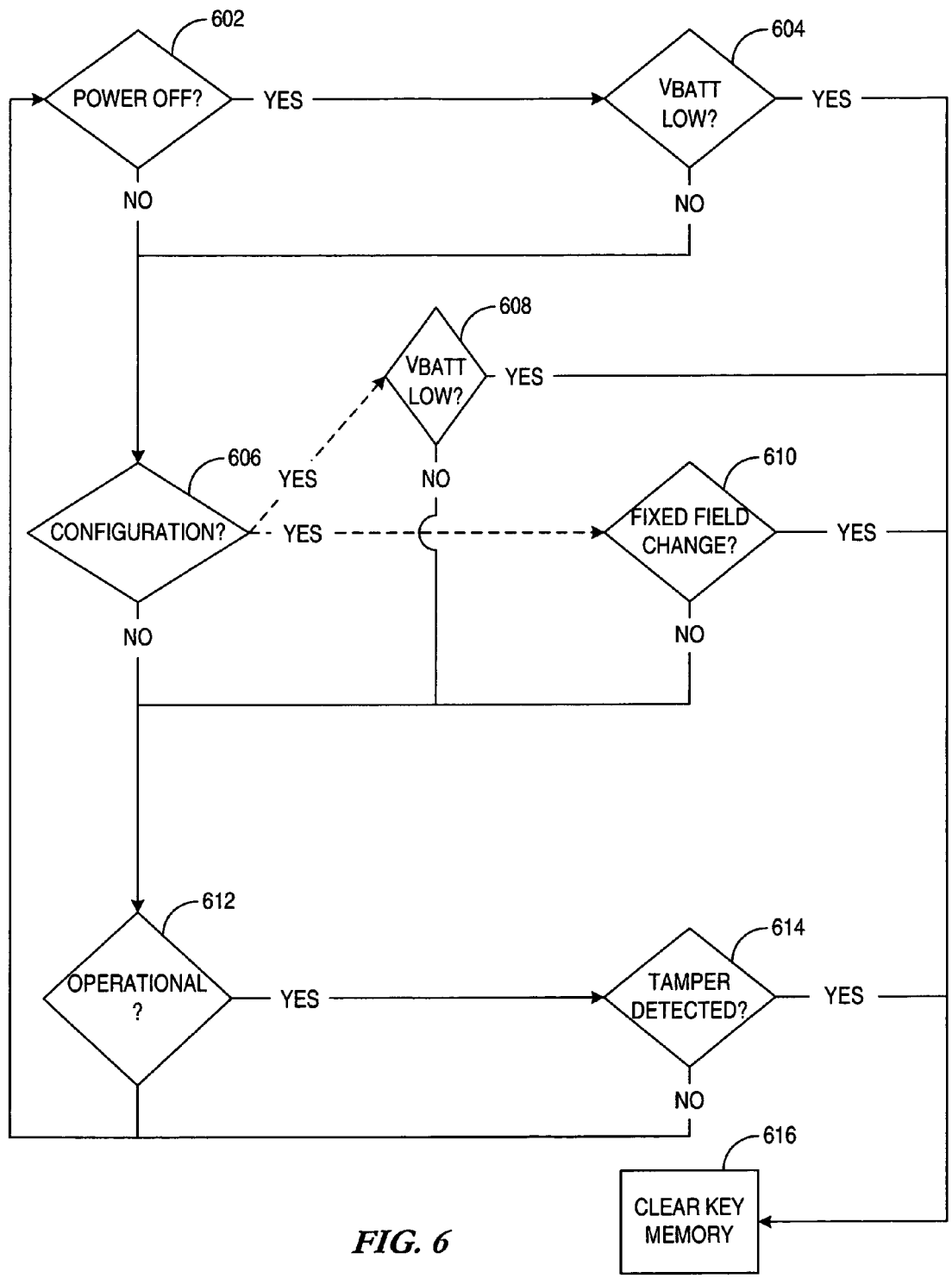
FIG. 6 illustrates a flow diagram of an exemplary method of protecting decryption keys within a PLD.

Turning to FIG. 6, an exemplary flow diagram of a method of protecting decryption keys within a PLD is illustrated. In step 602, a determination is made as to whether the PLD is currently in an idle state. If so, then the power supplies used to provide operational power to the PLD are not at an operational voltage level and a battery voltage, $V_{BATT}$, is used to maintain decryption keys accessible within volatile RAM. If $V_{BATT}$ is determined in step 604 to be below operational levels, then a determination is made to clear decryption key memory as in step 616. Decryption key memory may be cleared in either of a passive, or an active, zeroization sequence, as discussed above.

If the PLD is currently in its configuration state, as determined in step 606, then two optional methods may be exercised to determine whether PLD tampering has been conducted. In step 608, logic block 322 as exemplified in FIG. 4 may be used to detect a high to low battery voltage transition during a period that signal POR is in an active state. If a falling edge on $V_{BATT}$ is detected during a configuration sequence, then decryption key memory may be cleared as in step 616, using either of a passive, or an active, zeroization sequence, as discussed above.

Alternatively, or additionally, step 610 may be used to determine whether PLD tampering has been attempted. In particular, a fixed field signal, e.g., signal KEY SET, may be loaded into battery backed register 502 of FIG. 5 during decryption key loading. The battery backed signal KEY SET may then be monitored for any decay effects that may have occurred due to a battery power interruption as determined in step 610. If the interruption occurred during the configuration sequence, then decryption key memory may be cleared using either of a passive, or an active, zeroization sequence, as discussed above. It should be noted that active zeroization may be accomplished using either the battery voltage $V_{BATT}$ or the power supply voltage, $V_{CC}$. In a first embodiment, the need for zeroization is determined using battery power, while active zeroization is carried out using operational power provided by $V_{CC}$ once it becomes available. In an alternate embodiment, battery power (or alternately, the power provided by capacitor 406) is used both for tamper detection and active zeroization.

If the PLD is operational, as determined by step 612, then tamper detection may be implemented, for example, through the use of a multi-bit KEY CLEAR command, which forces a particular sequence of bits to occur over one or more PLD command frames. Should the KEY CLEAR command be perturbed in any way as determined in step 614, then an active zeroization sequence may be commenced by default as in step 616.

It should be noted that other methods for tamper detection may be used as known by one of ordinary skill and applied as in step 614 to activate the zeroization sequence of step 616. For example, read access from the decryption key memory locations of battery backed RAM 310 may be monitored while in the operational state. If decryption key read access is attempted during the operational state, then the battery backed RAM 310 may first be disabled and then the zeroization circuitry activated to destroy the decryption keys using an active zeroization sequence as discussed above.

Other aspects and embodiments of the present invention will be apparent to those skilled in the art from consideration of the specification and practice of the invention disclosed herein. For example, although various embodiments have been described in terms of the protection of decryption keys within battery backed RAM, the zeroization structures and methods described herein may be similarly applied in a number of data protection implementations, regardless of the data type that is being stored in the memory. It is intended that the specification and illustrated embodiments be considered as examples only, with a true scope and spirit of the invention being indicated by the following claims.

What is claimed is:

1. An integrated circuit (IC), comprising:
 a memory storage device coupled to a power supply, the memory storage device further coupled to receive data and adapted to store the data in protected memory within the memory storage device;
 a detection circuit coupled to the power supply, the detection circuit adapted to detect a power loss associated with the power supply in all phases of operation of the IC and further adapted to provide a tamper signal in response to detecting the power loss; and
 a zeroization circuit coupled to the memory storage device and the detection circuit, the zeroization circuit adapted to overwrite the protected memory in response to the tamper signal.

2. The IC of claim 1, wherein the detection circuit comprises a logic gate having a first input coupled to the power supply, a second input coupled to receive a signal indicative of an operational state of the IC and an output adapted to provide the tamper signal.

3. The IC of claim 1, wherein the detection circuit comprises:
 a latch having an input coupled to the power supply, a power supply input coupled to receive operational power, and a clock input coupled to receive a trigger signal; and
 a trigger circuit coupled to the power supply and the latch, the trigger circuit adapted to provide the trigger signal in response to detecting the power loss.

4. The IC of claim 3, wherein the detection circuit further comprises a capacitive storage element coupled to the power supply and adapted to provide the operational power to the latch.

5. The IC of claim 4, wherein the detection circuit further comprises a logic gate coupled to an output of the latch and coupled to receive a signal indicative of an operational state of the IC.

6. The IC of claim 5, wherein the detection circuit further comprises a register coupled to an output of the logic gate and coupled to receive the signal indicative of an operational state of the IC, the register being adapted to assert the tamper signal if the trigger signal occurred during a non-operational state of the IC.

7. The IC of claim 1, wherein the detection circuit comprises:
 a register coupled to the power supply and further coupled to receive a verification code, the register being adapted to store the verification code; and
 a comparator coupled to the register and coupled to receive the verification code and the stored verification code, the comparator being adapted to detect variations in the stored verification code.

8. The IC of claim 7, wherein the detection circuit further comprises a logic gate coupled to an output of the comparator and coupled to receive a signal indicative of an operational state of the IC.

9. The IC of claim 8, wherein the detection circuit further comprises a register coupled to an output of the logic gate and coupled to receive the signal indicative of an operational state of the IC, the register being adapted to assert the tamper signal if the variations in the stored verification code occurred during a non-operational state of the IC.

10. A method of protecting sensitive data within an integrated circuit (IC), the method comprising:
   storing sensitive data within protected memory locations of the IC;
   detecting unauthorized access to the protected memory locations in all phases of operation of the IC; and
   destroying the sensitive data in response to detecting the unauthorized access to the protected memory locations.

11. The method of claim 10, wherein storing sensitive data comprises:
   applying a battery voltage to random access memory (RAM) of the IC, the RAM deriving operational power from the battery voltage; and
   storing decryption keys within the RAM.

12. The method of claim 11, wherein detecting unauthorized access comprises detecting a low battery voltage during an idle state of the IC.

13. The method of claim 12, wherein detecting unauthorized access comprises detecting a low battery voltage during a configuration state of the IC.

14. The method of claim 13, wherein detecting a low battery voltage comprises latching a voltage transition of the battery voltage during the configuration state of the IC.

15. The method of claim 13, wherein detecting a low battery voltage comprises:
   applying the battery voltage to a register within the IC;
   storing a verification code within the register; and
   detecting a fixed field change in the verification code.

16. The method of claim 11, wherein detecting unauthorized access comprises detecting a perturbed zeroization command signal during an operational state of the IC.

17. A programmable logic device (PLD), comprising:
   a memory storage device coupled to receive decryption keys and adapted to store the decryption keys in a protected memory location within the memory storage device;
   a decryptor coupled to receive the decryption keys from the memory storage device and coupled to receive an encrypted configuration data stream, the decryptor being adapted to decrypt the encrypted configuration data stream using the decryption keys to configure the PLD; and
   a zeroization circuit coupled to the memory storage device and coupled to receive a zeroization command signal, the zeroization circuit being adapted to overwrite the protected memory location with zeroization data in response to the zeroization command signal.

18. The PLD of claim 17, wherein the zeroization circuit comprises:
   a first latch coupled to receive the zeroization command signal, the first latch being adapted to provide the zeroization command signal to a first output terminal of the first latch in response to a clock signal; and
   a second latch coupled to receive the zeroization command signal from the first output terminal and adapted to provide the zeroization command signal to a second output terminal of the second latch in response to the clock signal.

19. The zeroization circuit of claim 18, further comprising a logic gate coupled to receive the zeroization command signal from the first and second output terminals and coupled to provide a verified zeroization command signal to an output terminal of the logic gate.

20. The zeroization circuit of claim 19, further comprising:
   a first multiplexer coupled to the output terminal of the logic gate and adapted to select an address of the protected memory location in response to the verified zeroization command signal; and
   a second multiplexer coupled to the output terminal of the logic gate and adapted to select the zeroization data in response to the verified zeroization command signal.

* * * * *